(12) United States Patent
Gossmann

(10) Patent No.: US 6,518,789 B2
(45) Date of Patent: Feb. 11, 2003

(54) CIRCUIT CONFIGURATION FOR CONVERTING LOGIC LEVELS

(75) Inventor: Timo Gossmann, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/881,433

(22) Filed: Jun. 14, 2001

(65) Prior Publication Data

US 2002/0003437 A1 Jan. 10, 2002

(51) Int. Cl.[7] .............................................. H03K 19/175

(52) U.S. Cl. ............................. 326/64; 326/75; 326/84; 326/89; 326/109; 326/110

(58) Field of Search .............................. 326/64–67, 70, 326/71, 73–78, 84, 89, 109, 110

(56) References Cited

U.S. PATENT DOCUMENTS

| | | | | |
|---|---|---|---|---|
| 4,779,016 A | * | 10/1988 | Sugiyama et al. | 307/475 |
| 4,906,871 A | * | 3/1990 | Iida | 307/475 |
| 5,012,137 A | * | 4/1991 | Muellner | 307/475 |
| 5,631,580 A | * | 5/1997 | Rau | 326/66 |

* cited by examiner

*Primary Examiner*—Michael Tokar
(74) *Attorney, Agent, or Firm*—Laurence A. Greenberg; Werner H. Stemer; Ralph E. Locher

(57) ABSTRACT

The circuit configuration for converting logic levels has a bipolar input stage and a CMOS output stage. The bipolar input stage is equipped to process ECL and CML logic levels. The CMOS-logic output stage is equipped to supply trailing CMOS gates having CMOS logic levels. A difference amplifier includes bipolar transistors, which are connected to a common emitter current source and to separate collector current sources. An input-output feedback CMOS inverter is connected to one of the collectors, and the output of the inverter is coupled to an output node.

5 Claims, 3 Drawing Sheets

CIRCUIT CONFIGURATION FOR CONVERTING LOGIC LEVELS

BACKGROUND OF THE INVENTION

Field of the Invention

The invention relates to a circuit configuration for converting logic levels.

Modern CMOS technologies already make possible operating frequencies of several hundred MHz. However, in the past it has not been practicable to utilize pure CMOS circuit technology in frequency ranges wherein mobile radiotelephone applications are operated. These are frequencies in the range of 900 MHz, 1800 MHz, and 1900 MHz, for example.

In digital CMOS circuit technology, it is common for the logic states high and low to correspond to the upper and lower supply voltages, respectively (rail to rail logic). Consequently, it is necessary to cross over the complete range of supply voltages each time the logic state is switched from high to low or vice versa. This means that parasitic capacitors must be recharged to maximum with each switching process. For this reason, the dynamic power consumption of a CMOS logic is very high. Another disadvantage of this CMOS logic is that high noise levels are generated on the supply potential and the reference potential by the switching processes. The currently achievable rail-to-rail switching speeds are not yet high enough to be utilized in frequency ranges of several GHz, and consequently this circuit technology cannot yet be reasonably utilized in applications in mobile radiotelephone frequency ranges.

A differential logic with slight differences between the logic levels high and low, which has a similar structure to an SML or BCL logic such as is known from bipolar switching technology, is therefore standard in the current state of the art for the highest switching speeds in the GHz range.

In processing lower frequencies, rail to rail CMOS circuitry has a low space consumption, no static power consumption, and high resistance to noise, and saves bias currents as well. For these reasons, modern circuit designs utilize BICMOS processes, wherein complete bipolar and CMOS processes are unified. The circuit parts that operate at high frequencies are built in bipolar technology (CML/ECL), and the lower frequencies are processed using rail to rail CMPS logics.

The problem arises that an interface must be formed between the two circuit parts with ECL/CML logic levels and CMOS logic levels. The ECL/CML logic levels are present in differential form; they typically comprise a voltage range of approx. ±100 mV on each of the two signal lines; and they are situated symmetrically relative to a mid-potential. By contrast, the CMOS circuit parts are furnished with a separate voltage supply and comprise logic levels ranging from the CMOS supply potential to the (common) ground potential.

CMOS gates have a steep switchover characteristic in a limited switchover voltage range wherein the gates switch rapidly. The switchover point of a CMOS gate is dependent upon both the temperature and the supply voltage, as well as on process fluctuations in the production process. A direct coupling of bipolar and CMOS circuits is difficult in practice, since the production tolerances in the bipolar and CMOS circuit parts correlate with each other poorly if at all, so that they disadvantageously leak, and the correct switching behavior is no longer guaranteed owing to divergent bias conditions.

One solution to this problem, which is disclosed in U.S. Pat. No. 6,008,667, is to use the two levels of a differential logic signal as an input signal and to convert the logic level accordingly.

SUMMARY OF THE INVENTION

The object of the present invention is to provide a circuit configuration for converting logic levels which overcomes the above-noted deficiencies and disadvantages of the prior art devices and methods of this general kind, and which makes possible a larger limit frequency given a smaller noise factor.

With the above and other objects in view there is provided, in accordance with the invention, a circuit configuration for converting logic levels, comprising:

a first bipolar transistor having an emitter, a collector, and a base;

a second bipolar transistor having an emitter, a collector, and a base;

a first current source connected to the emitter of the first bipolar transistor and to the emitter of the second bipolar transistor;

a second current source connected to the collector of the first bipolar transistor;

a third current source connected to the collector of the second bipolar transistor;

an input-output feedback inverter connected to the collector of the first bipolar transistor; and an output node connected to and controllable by the input-output feedback inverter.

In other words, the objects are achieved by a circuit configuration for converting logic levels which includes a first bipolar transistor comprising an emitter, a collector and a base and a second bipolar transistor comprising an emitter, a collector and a base; whereby the emitter of the first bipolar transistor and the emitter of the second bipolar transistor are connected to a first current source; the collector of the first bipolar transistor is connected to a second current source; and the collector of the second bipolar transistor is connected to a third current source; and whereby a first input-output feedback inverter is connected to the collector of the first bipolar transistor, and an output node is activatable by the first feedback transistor.

In the operation of the circuit, a differential logic signal is applied to the base of the first bipolar transistor and to the base of the second bipolar transistor as the input signal. If there is no difference between the voltages at the bases of the first and second transistors, the sum of the two currents impressed on the collectors equals the current which flows through the common emitter current source. In this case, the first inverter is in an idle state. However, if there is a difference in the voltages of the first and second bases, a greater current flows through one of the bipolar transistors, and a smaller current flows through the other bipolar transistor. In this case, the additional current is delivered from the output of the first inverter. In this context, the term "input-output feedback inverter" refers to an inverter whose input and output are connected to each other.

Since the output voltage of the first inverter thus varies, this can be compared to a reference at the output node in order to deliver an output signal with CMOS logic levels. The feedback inverter acts here as a current-voltage converter whose characteristic puts it in the position to hold a node at a voltage value given low impedance. The advantage of this is that a greater limit frequency is achieved, since the inverter comprises a high driver power.

In accordance with an added feature of the invention, in addition to the first above-noted input-output feedback inverter a second input-output feedback inverter is connected to the collector of the second bipolar transistor, and the output node is connected to and controlled with the aid of the second feedback inverter. The output voltage of the first feedback inverter can be compared to the output voltage of the second feedback inverter in the output node. Since the two bipolar transistors work in opposite directions, the signals generated by the two feedback inverters also run in opposite directions, which expediently expands the signal range.

In accordance with an additional feature of the invention, the first inverter and the second inverter are coupled via a current mirror. This development is particularly advantageous due to the ability to convert the voltages at the feedback inverters with the aid of transistors into currents, which can then be compared to each other in the output node with the aid of the current mirror.

In accordance with another feature of the invention, the circuit further comprises:

a first transistor having a drain, a second transistor having a drain, and a first node connected between the drain, the first transistor having a gate connected to the collector of the first bipolar transistor, and the second transistor having a gate connected to the first node; and a third transistor having a drain connected to the output node and a fourth transistor having a drain connected to the output node, the third transistor having a gate connected to the gate of the second transistor, and the fourth transistor having a gate connected to the second feedback inverter.

The advantage of said circuit configuration is that the output voltages of the first and second inverters can be compared in the output node to the current through the fourth transistor with the aid of a first transistor and the current reflecting device which comprises the second and third transistors.

In accordance with a further feature of the invention, an operational amplifier has a first input connected to a third input-output feedback inverter, a second input, and an output connected to a control input of the second and third current sources. That is, an operational amplifier with first and second inputs and an output be so arranged that the first input is connected to a third input-output feedback inverter, whereas the output is connected to a control input of the second current source and to a control input of the third current source. The advantage of the operational amplifier is that the operating point of the first and second inverters is set with the aid of a third feedback inverter.

In accordance with a concomitant feature of the invention, a third inverter has an input connected to the collector of the first bipolar transistor, and an output connected to the collector of the second bipolar transistor.

Other features which are considered as characteristic for the invention are set forth in the appended claims.

Although the invention is illustrated and described herein as embodied in a circuit configuration for converting logic levels, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
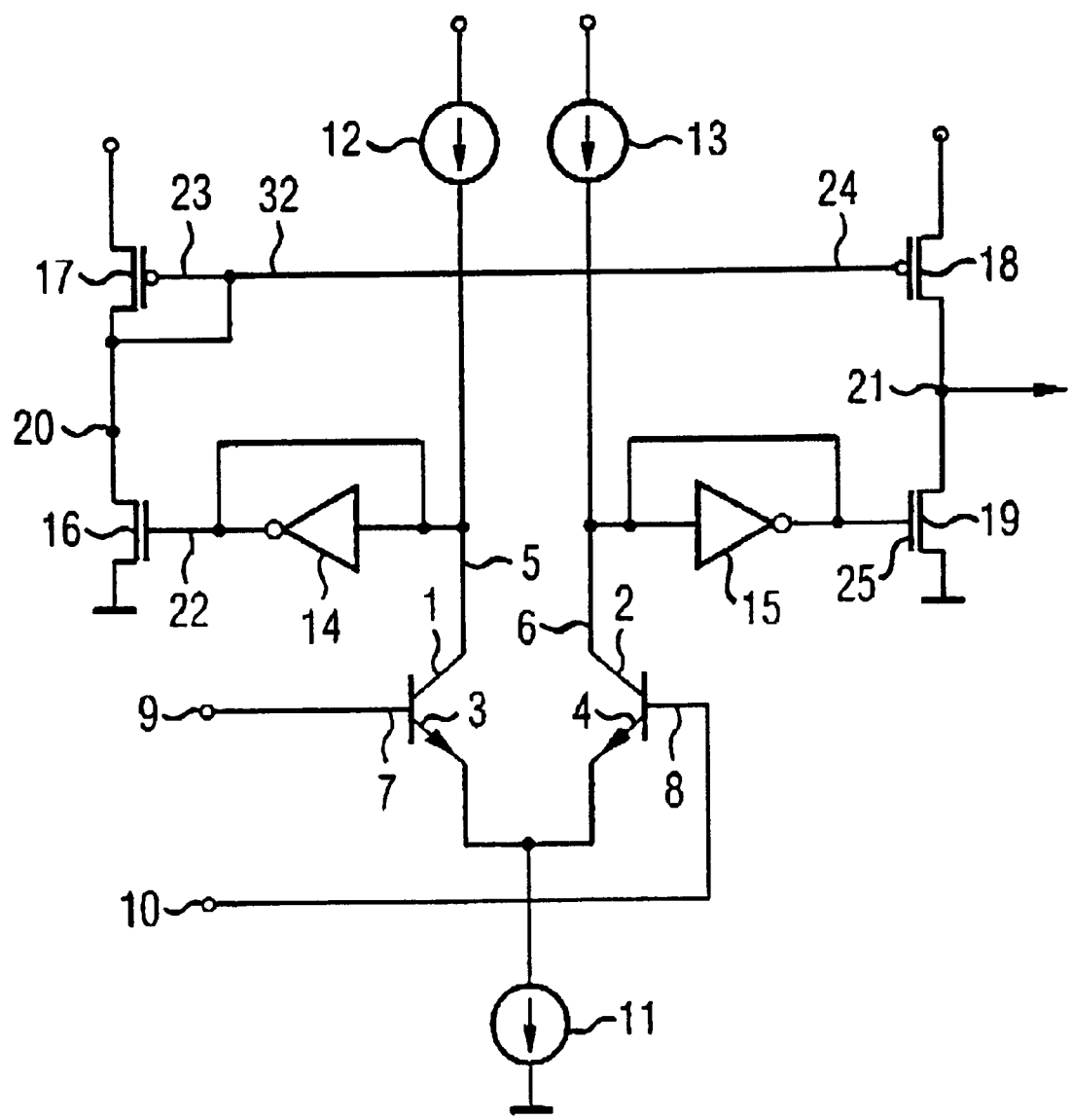
FIG. 1 is a circuit schematic illustrating a circuit for converting logic levels according to the invention.

Referring now to the figures of the drawing in detail and first, particularly, to FIG. 1 thereof, there is seen a first bipolar transistor 1 and a second bipolar transistor 2. The first bipolar transistor 1 comprises a first emitter 3, a first collector 5, and a first base 7. The second bipolar transistor 2 comprises a second emitter 4, a second collector 6 and a second base 8. The first emitter 3 and the second emitter 4 are connected to a first current source 11. The first collector 5 is connected to a second current source 12, and the second collector 6 is connected to a third current source 13. The first base 7 is connected to a first input 9, and the second base 8 is connected to a second input 10. The first collector 5 is connected to a first feedback inverter 14. The second collector 6 is connected to a second feedback inverter 15. A first transistor 16 and a second transistor 17 are connected to each other at node 20 with their respective drain regions. The gate 22 of the first transistor 16, is connected to the collector 5 of the first bipolar transistor 1 and the gate 23 of the second transistor 17 is connected to the first node 20. A third transistor 18 and a fourth transistor 19 are connected to each other at an output node 21 with their respective drain regions. Gates 24 and 25 of the third and fourth transistors, respectively, are connected to the gate 23 of the second transistor 17 and to the second feedback inverter 15, respectively.

The idle state of the circuit configuration represented in FIG. 1 provides that there be no initial difference between the voltages at the first and second inputs 9 and 10. In this state, the first and second bipolar transistors 1 and 2 are passed by the same current, which is impressed by the second and third current sources 12 and 13, respectively, and whose sum forms the current of the first current source 11. In this state, no current flow is provided in the first and second feedback inverters 14 and 15, respectively. However, if there is a difference in the voltages at the first and second inputs 9 and 10, respectively, the current through the first and second bipolar transistors 1 and 2 is no longer equal, and a current flows in the first and second feedback inverters 14 and 15. The output voltage of the first feedback inverter 14 is deflected from the open-circuit voltage level in the direction opposite the output voltage of the second feedback inverter 15. The voltages at the outputs of the first and second feedback inverters 14 and 15, respectively, are merged corresponding to the current mirror 32, which consists of the transistors 16, 17, 18, and 19, and are thereby converted from opposite voltage characteristics at the collectors 5 and 6 of the first and second bipolar transistors 1 and 2, respectively, into a unipolar output voltage at the output node 21. The gates 22 and 25 of the first and fourth transistors 16 and 19 are respectively controlled by the first and second feedback inverters 14 and 15. The current through the fourth transistor 19 flows into the output node 21 and is compared to the current through the first transistor 16, which likewise flows into the node 21 by way of transistors 17, 18 of the current mirror. A trailing inverter may, by way of example, connected to the output node 21. Since it is important for the function that there be good synchronism of the first feedback inverter relative to the second feedback inverter 15, the two feedback inverters 14, 15 should be identically constructed. In this regard, it is expedient to arrange the first and second feedback inverters 14 and 15 adjacent and symmetrically relative to each other and to position the first through fourth transistors 16, 17, 18 and 19 adjacent to one another, in order to minimize variations of the transistor parameters incident to processing. Furthermore, it is advantageous when the transistors of the two feedback inverters correspond to the first to fourth transistors 16 to 19 of the current mirror 32, and for the channel widths of the P-MOS transistors and N-MOS transistors to have the same size ratio.

Figure 2:
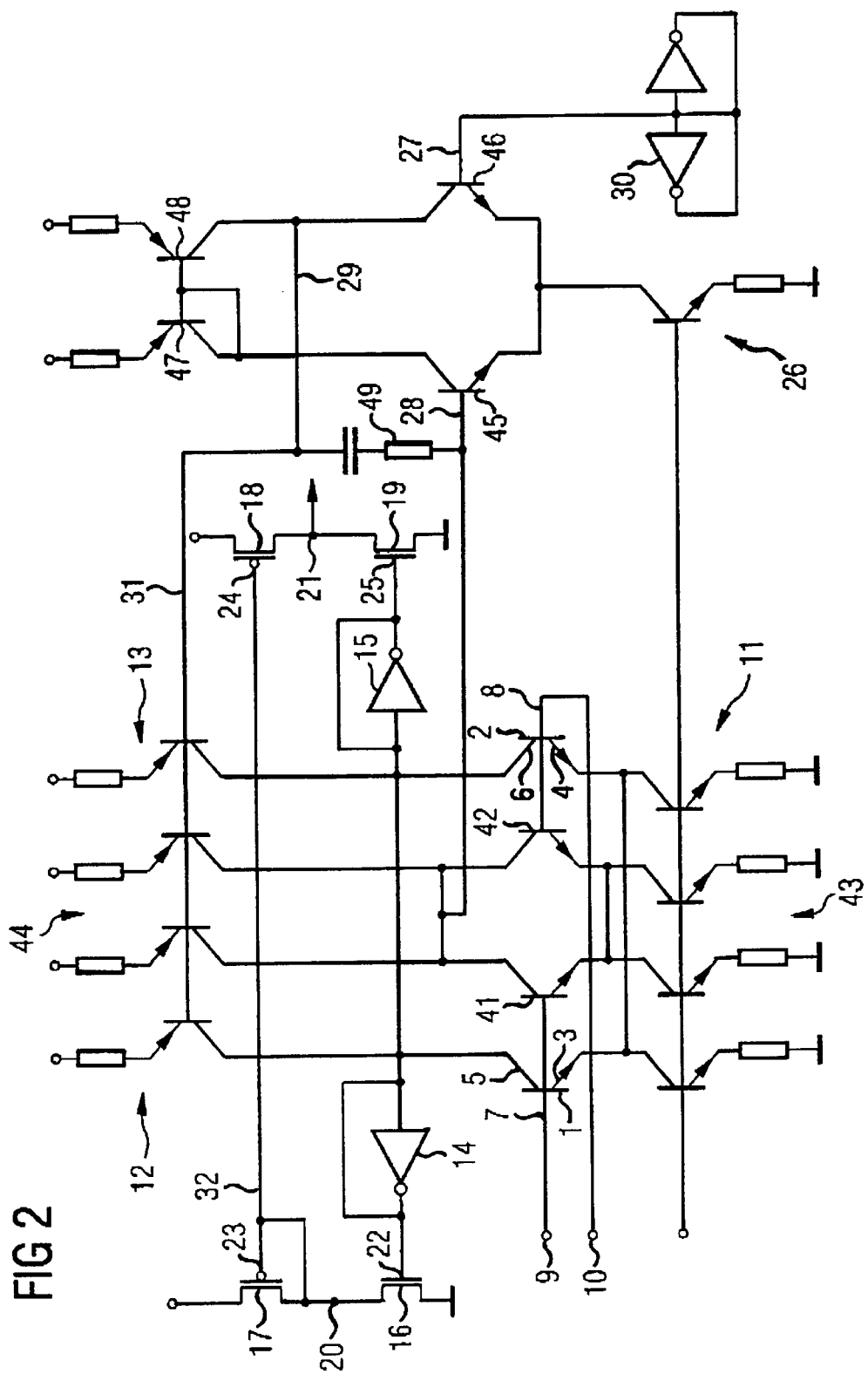
FIG. 2 is a circuit schematic illustrating another exemplary embodiment of a circuit for converting logic levels.

FIG. 2 shows a more detailed exemplary embodiment of the circuit configuration represented in FIG. 1. In addition to the circuit components represented in FIG. 1, the current sources 11, 12 and 13 are realized in FIG. 2 by bipolar transistors. In addition, an operational amplifier 26 is included, which is suitable for setting the operating point of the first and second feedback inverters 14 and 15 on the basis of the controlling of the second and third current sources 12 and 13, respectively. To this end, the bases of third and fourth bipolar transistors 41 and 42 are connected to the first and second inputs 9 and 10, respectively. The emitters of the third and fourth bipolar transistors 41 and 42 are connected to each other and to a fourth current source 43. Furthermore, the two collectors of the third and fourth bipolar transistors 41 and 42, respectively, are connected to each other and to a fifth current source 44. The operational amplifier 26 comprises a fifth bipolar transistor 45, a sixth bipolar transistor 46, a seventh bipolar transistor 47, and an eighth bipolar transistor 48. The seventh bipolar transistor 47 is fed back between its base and its collector, so that, with the eighth bipolar transistor 48, it forms a current mirror 32 which is connected to the collectors of the fifth and sixth bipolar transistors 45 and 46, respectively. Beyond this, the two emitters of the fifth and sixth bipolar transistors 45 and 46 are connected to each other and to a current source. The base of the sixth bipolar transistor 46 represents the first input 27 of the operational amplifier, which is connected to a third feedback inverter 30. The base of the fifth bipolar transistor 45 represents the second input 28 of the operational amplifier, which is connected to the two collectors of the third and fourth bipolar transistors 41 and 42, respectively. The output of the operational amplifier 29 is connected to the second input 28 of the operational amplifier by way of a frequency response compensation 49. The output 29 of the operational amplifier is connected to the control inputs of the second current source 12, the third current source 13, and the fifth current source 44.

The operational amplifier 26 is used for controlling the operating point of the first and second feedback inverters 14 and 15. The output signal of the third feedback inverter 30 is used as the reference quantity, i.e. the reference input variable, and is fed to the first input 27 of the operational amplifier. The operational amplifier 26 now attempts to set itself such that the same voltage is present at its second and first inputs 28 and 27. To accomplish this, the signal that is present at the output 29 of the operational amplifier is utilized to control the second, third and fifth current sources 12, 13 and 44, respectively. On the basis of this control process, the voltage at the first and second feedback inverters 14 and 15 sets itself to the output voltage of the third feedback inverter 30 in the idle state (no voltage difference between the first and second inputs 9, 10).

Figure 3:
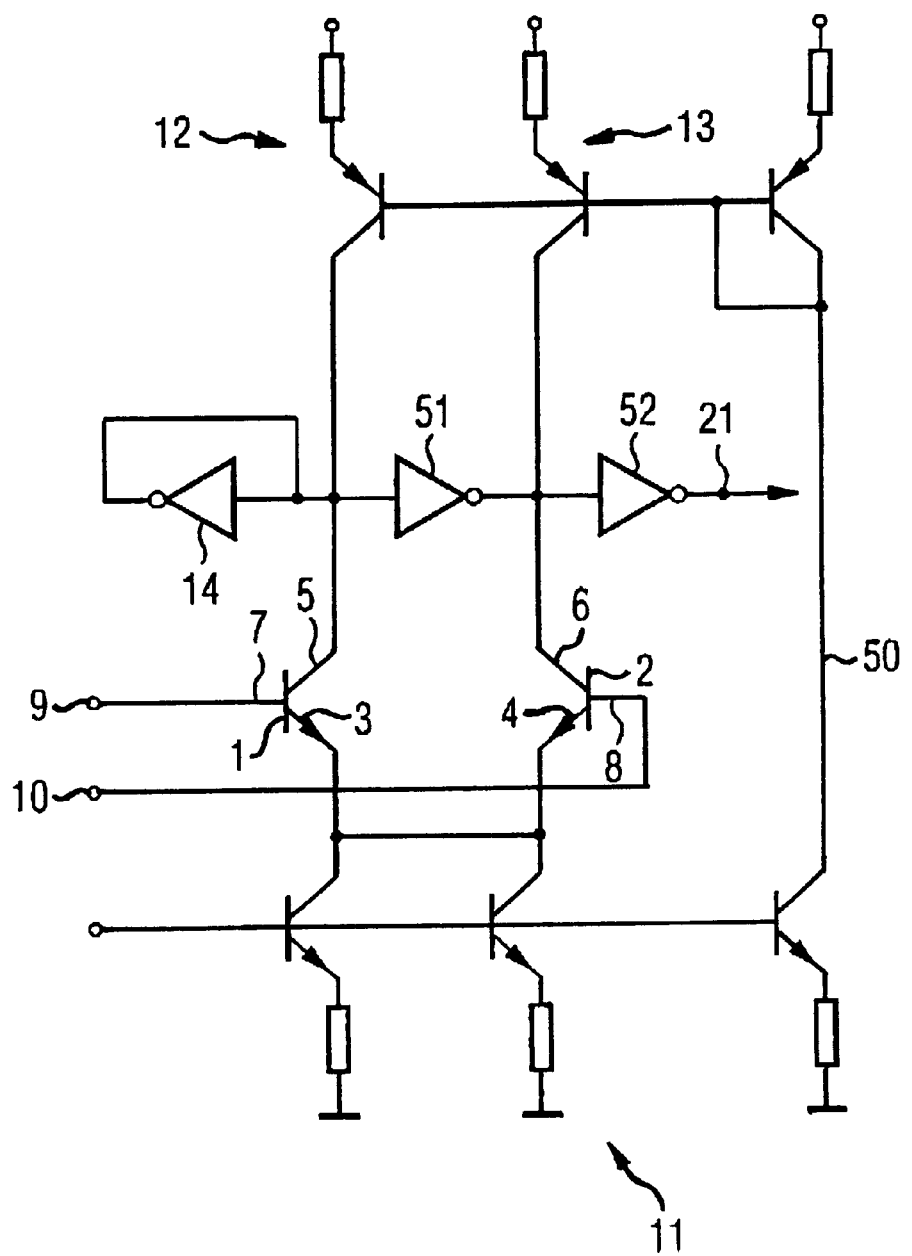
FIG. 3 is a circuit schematic illustrating a third exemplary embodiment of a circuit for converting logic levels.

FIG. 3 shows another exemplary embodiment of a circuit for converting logic levels. The circuit in FIG. 3 comprises first and second bipolar transistors 1 and 2. The first bipolar transistor 1 comprises an emitter 3, a collector 5, and a base 7; and the second bipolar transistor 2 comprises an emitter 4, a collector 6, and a base 8. The emitters 3 and 4 of the first and second bipolar transistors 1 and 2 are respectively connected to a first current source 11. The collector 5 of the first bipolar transistor 1 is connected to a second current source 12, and the collector 6 of the second bipolar transistor 2 is connected to a third current source 13. The first current source 11 is connected to the second current source 12 and the third current source 13 by way of a current source control 50. The bases 7 and 8 of the first and second bipolar transistors 1 and 2 are connected to first and second inputs 9 and 10, respectively. The collector 5 of the first bipolar transistor 1 is connected to an input-output feedback inverter 14. The input of the inverter 14 is connected to the output of the inverter 14. An input of a third inverter 51 is connected to the collector 5 of the first bipolar transistor 1, and an output of the third inverter 51 is connected to the collector 6 of the second bipolar transistor 2. The input of a fourth inverter 52 is connected to the collector 6 of the second bipolar transistor 2, and the output of the fourth inverter 52 is connected to an output node 21.

In an idle state, a voltage generated by the feedback inverter 14 at the collector 5 of the first bipolar transistor 1 corresponds to the changeover voltage of the inverter 14. For instance, if the third inverter 51 comprises the same dimensioning as the first feedback inverter 14, the voltages at the collectors 6 and 5 of the second and first bipolar transistors 2 and 1, respectively, are equal.

But if a voltage difference is applied between the first and second inputs 9 and 10, the voltages of the collectors 5 and 6 of the first and second bipolar transistors 1 and 2 move into opposite phases, which is facilitated by the behavior of the third inverter 51. The fourth inverter 52 additionally amplifies the logic signal at the collector 6 of the second bipolar transistor 2, so that there is a CMOS logic level at the output node 21.

I claim:

1. A circuit configuration for converting logic levels, comprising:
   a first bipolar transistor having an emitter, a collector, and a base;
   a second bipolar transistor having an emitter, a collector, and a base;
   a first current source connected to said emitter of said first bipolar transistor and to said emitter of said second bipolar transistor;
   a second current source connected to said collector of said first bipolar transistor;
   a third current source connected to said collector of said second bipolar transistor;
   a first input-output feedback inverter connected to said collector of said first bipolar transistor;
   a second input-output feedback inverter connected to said collector of said second bipolar transistor; and
   an output node connected to and controllable by said first and second input-output feedback inverters.

2. The circuit configuration according to claim 1, wherein said first feedback inverter and said second feedback inverter are coupled via a current mirror.

3. A circuit configuration for converting logic levels, comprising:

a first bipolar transistor having an emitter, a collector, and a base;

a second bipolar transistor having an emitter, a collector, and a base;

a first current source connected to said emitter of said first bipolar, transistor and to said emitter of said second bipolar transistor;

a second current source connected to said collector of said first bipolar transistor;

a third current source connected to said collector of said second bipolar transistor;

an input-output feedback inverter connected to said collector of said first bipolar transistor;

an output node connected to and controllable by said input-output feedback inverter;

a first transistor having a drain, a second transistor having a drain, and a first node connected between said drains, said first transistor having a gate connected to said collector of said first bipolar transistor, and said second transistor having a gate connected to said first node; and a third transistor having a drain connected to said output node and a fourth transistor having a drain connected to said output node, said third transistor having a gate connected to said gate of said second transistor, and said fourth transistor having a gate connected to said second feedback inverter.

4. A circuit configuration for converting logic levels, comprising:

a first bipolar transistor having an emitter, a collector, and a base;

a second bipolar transistor having an emitter, a collector, and a base;

a first current source connected to said emitter of said first bipolar transistor and to said emitter of said second bipolar transistor;

a second current source connected to said collector of said first bipolar transistor and having a control input;

a third current source connected to said collector of said second bipolar transistor and having a control input;

an input-output feedback inverter connected to said collector of said first bipolar transistor;

an output node connected to and controllable by said input-output feedback inverter; and an operational amplifier having a first input connected to another input-output feedback inverter, a second input, and an output connected to said control inputs of said second and third current sources.

5. A circuit configuration for converting logic levels, comprising:

a first bipolar transistor having an emitter, a collector, and a base;

a second bipolar transistor having an emitter, a collector, and a base;

a first current source connected to said emitter of said first bipolar transistor and to said emitter of said second bipolar transistor;

a second current source connected to said collector of said first bipolar transistor;

a third current source connected to said collector of said second bipolar transistor;

an input-output feedback inverter connected to said collector of said first bipolar transistor;

an output node connected to and controllable by said input-output feedback inverter; and another inverter having an input connected to said collector of said first bipolar transistor, and an output connected to said collector of said second bipolar transistor.

* * * * *

UNITED STATES PATENT AND TRADEMARK OFFICE
CERTIFICATE OF CORRECTION

PATENT NO. : 6,518,789 B2
DATED : February 11, 2003
INVENTOR(S) : Timo Gossmann

It is certified that error appears in the above-identified patent and that said Letters Patent is hereby corrected as shown below:

<u>Title page,</u>
Item [30], should read as follows:

-- Foreign Application Priority Data

Jun. 14, 2000          [EP]          .......... 001 12 586.2 --

Signed and Sealed this

Third Day of June, 2003

JAMES E. ROGAN
*Director of the United States Patent and Trademark Office*